(12) United States Patent
Ebata et al.

(10) Patent No.: US 11,170,995 B2
(45) Date of Patent: Nov. 9, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Shinya Ebata, Toyama (JP); Hiroaki Hiramatsu, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 72 days.

(21) Appl. No.: 16/575,471

(22) Filed: Sep. 19, 2019

(65) Prior Publication Data

US 2020/0098555 A1   Mar. 26, 2020

(30) Foreign Application Priority Data

Sep. 20, 2018 (JP) .............................. JP2018-175667

(51) Int. Cl.
*H01L 21/02* (2006.01)
*C23C 16/455* (2006.01)

(52) U.S. Cl.
CPC .... *H01L 21/0228* (2013.01); *C23C 16/45527* (2013.01); *H01L 21/0217* (2013.01)

(58) Field of Classification Search
None
See application file for complete search history.

(56) References Cited

U.S. PATENT DOCUMENTS

| | | |
|---|---|---|
| 2009/0197424 A1 | 8/2009 | Sakai et al. |
| 2011/0318940 A1 | 12/2011 | Ota et al. |
| 2014/0356550 A1 | 12/2014 | Tonegawa et al. |
| 2016/0284533 A1 | 9/2016 | Nagano |
| 2016/0289833 A1 | 10/2016 | Okada et al. |
| 2016/0358767 A1 | 12/2016 | Nitta et al. |
| 2017/0029945 A1 | 2/2017 | Kamakura |
| 2017/0051408 A1 | 2/2017 | Takagi et al. |

(Continued)

FOREIGN PATENT DOCUMENTS

| | | |
|---|---|---|
| JP | 2012-033874 A | 2/2012 |
| JP | 2016-181666 A | 10/2016 |

(Continued)

OTHER PUBLICATIONS

Singaporean Search Report dated Mar. 23, 2020 for the Singaporean Patent Application No. 10201908479T.

(Continued)

*Primary Examiner* — Asok K Sarkar
(74) *Attorney, Agent, or Firm* — Volpe Koenig

(57) ABSTRACT

There is provided a technique that includes forming a film on a substrate in a process chamber by performing a cycle a predetermined number of times, the cycle including non-simultaneously performing: (a) supplying a precursor gas from a first supplier to the substrate in the process chamber; and (b) supplying a reaction gas from a second supplier to the substrate in the process chamber, wherein in (a), an intermediate is generated by decomposing the precursor gas in the first supplier and in the process chamber, the intermediate is supplied to the substrate, and a decomposition amount of the precursor gas in the first supplier is set larger than a decomposition amount of the precursor gas in the process chamber.

18 Claims, 8 Drawing Sheets

(56) References Cited

U.S. PATENT DOCUMENTS

| | | |
|---|---|---|
| 2017/0232457 A1 | 8/2017 | Fujino et al. |
| 2018/0202043 A1 | 7/2018 | Sasaki et al. |
| 2019/0017169 A1 | 1/2019 | Hanashima et al. |
| 2019/0345605 A1 | 11/2019 | Mimura et al. |

FOREIGN PATENT DOCUMENTS

| | | |
|---|---|---|
| JP | 2017-005016 A | 1/2017 |
| WO | 2017/168513 A1 | 10/2017 |
| WO | 2018/154823 A1 | 8/2018 |

OTHER PUBLICATIONS

Singaporean Written Opinion dated Apr. 22, 2020 for the Singaporean Patent Application No. 10201908479T.
Written Opinion dated Feb. 2, 2021 for Singapore Patent Application No. 10201908479.
Japanese Office Action dated Feb. 16, 2021 for Japanese Patent Application No. 2018-175667.

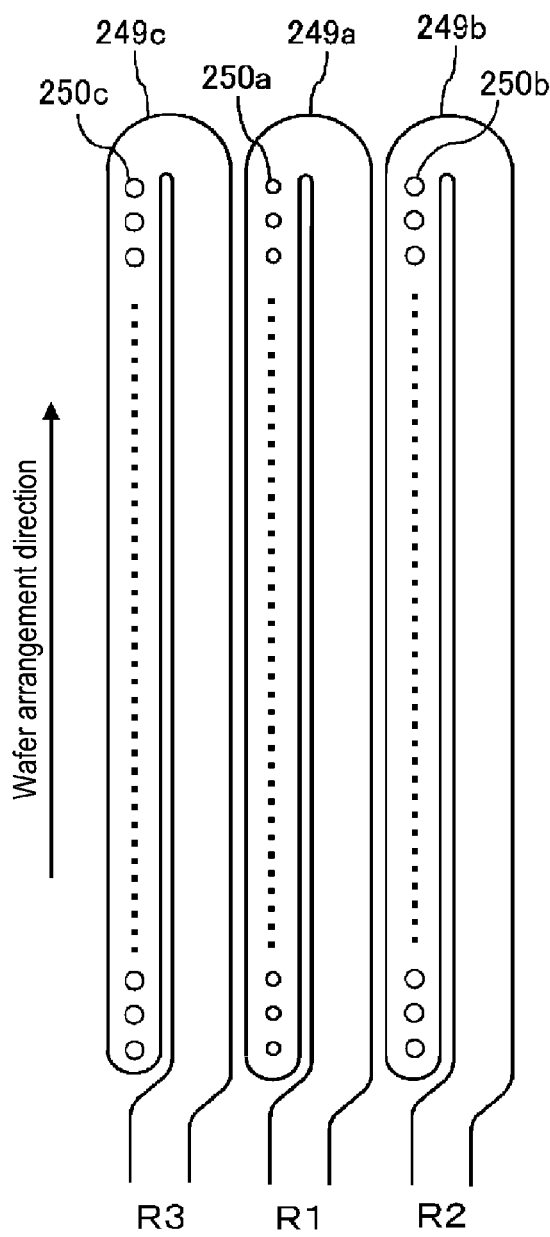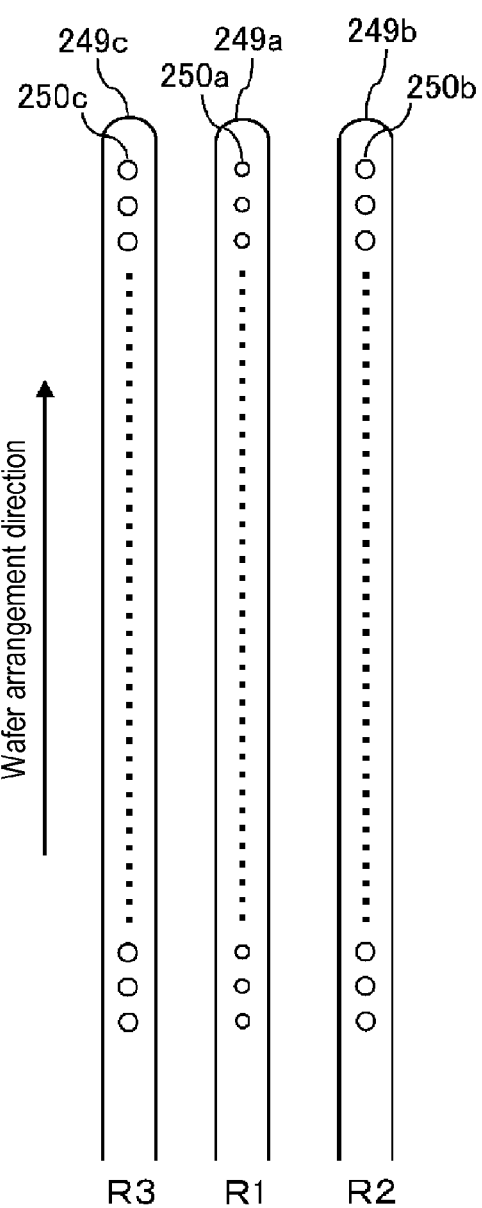

FIG. 8

|  | Comparative example 1 | Comparative example 2 | Embodiment example |
|---|---|---|---|
| R. I. Range | 0.041 | 0.048 | 0.020 |
| WiW [%] | 2.75 | 3.00 | 1.83 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japanese Patent Application No. 2018-175667, filed on Sep. 20, 2018, the entire contents of which are incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a substrate processing of forming a film on a substrate is often carried out by supplying a precursor gas or a reaction gas to the substrate in a process chamber.

SUMMARY

The present disclosure provides some embodiments of a technique capable of improving film quality uniformity of a film formed on a substrate in a plane of the substrate.

According to one or more embodiments of the present disclosure, there is provided a technique that includes forming a film on a substrate in a process chamber by performing a cycle a predetermined number of times, the cycle including non-simultaneously performing: (a) supplying a precursor gas from a first supplier to the substrate in the process chamber; and (b) supplying a reaction gas from a second supplier to the substrate in the process chamber, wherein in (a), an intermediate is generated by decomposing the precursor gas in the first supplier and in the process chamber, the intermediate is supplied to the substrate, and a decomposition amount of the precursor gas in the first supplier is set larger than a decomposition amount of the precursor gas in the process chamber.

BRIEF DESCRIPTION OF DRAWINGS

FIG. 6A is a schematic configuration diagram of first to third nozzles suitably used in the first and second embodiments of the present disclosure, and FIG. 6B is a schematic configuration diagram of first to third nozzles suitably used in other embodiments of the present disclosure.

FIG. 8 is a diagram illustrating evaluation results of refractive index uniformity and film thickness uniformity a film formed on a substrate in a plane of the substrate.

DETAILED DESCRIPTION

First Embodiments

First embodiments of the present disclosure will now be described with reference to FIGS. 1, 4, 6A, and the like.

(1) Configuration of the Substrate Processing Apparatus

Figure 1:
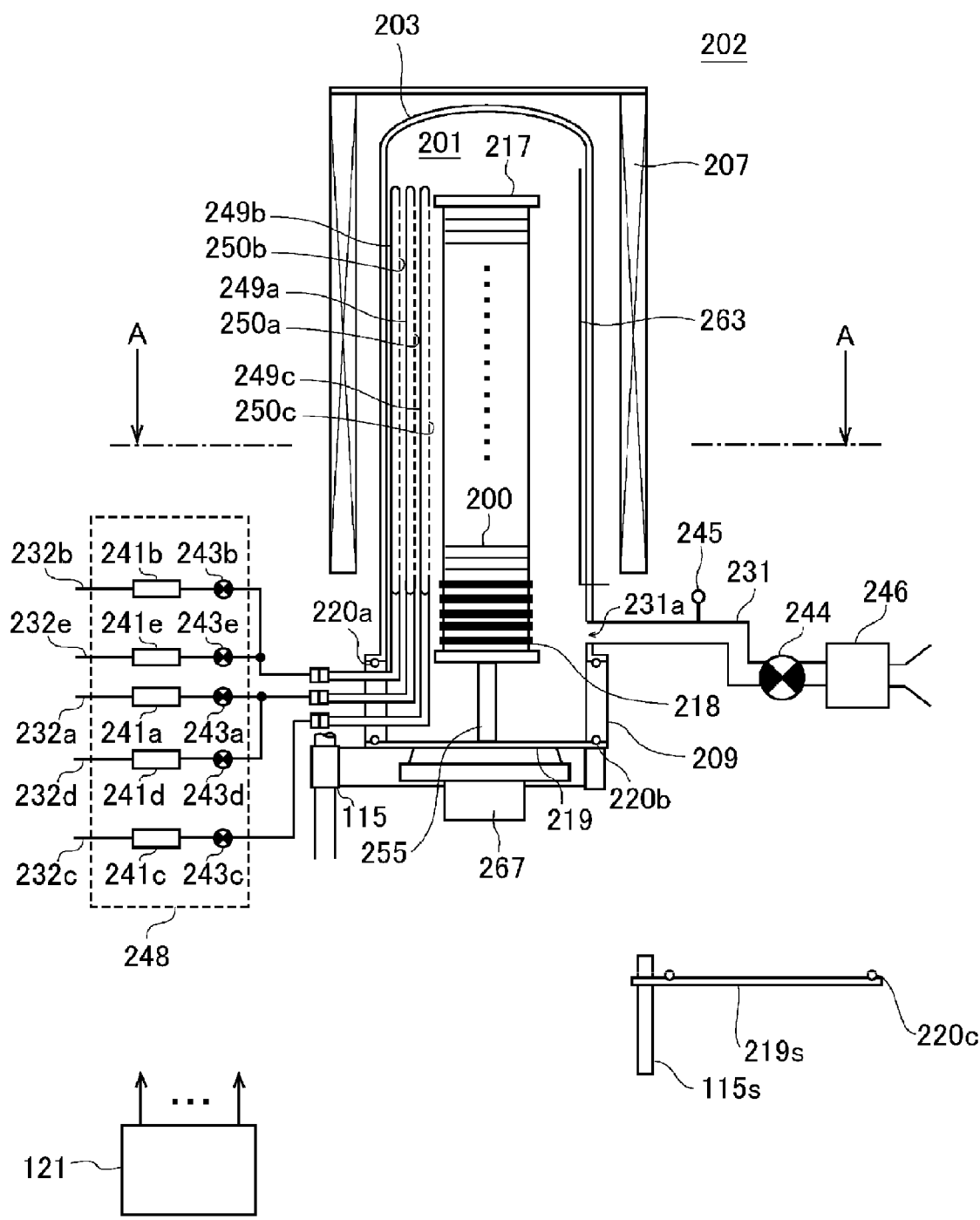
FIG. 1 is a schematic configuration diagram of a vertical type process furnace of a substrate processing apparatus suitably used in embodiments of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas. The heater 207 also functions as a decomposition unit (decomposer) configured to decompose a precursor gas in each of a nozzle 249a as a first supply part (first supplier) and a process chamber 201 as described hereinbelow.

A reaction tube 203 is disposed inside the heater 207 to be concentric with the heater 207. The reaction tube 203 is made of a heat resistant material, e.g., quartz ($SiO_2$), silicon carbide (SiC), or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS) or the like, and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process vessel (reaction vessel) mainly includes the reaction tube 203 and the manifold 209. The process chamber 201 is formed in a hollow cylindrical portion of the process vessel. The process chamber 201 is configured to accommodate wafers 200 as substrates. The processing of the wafers 200 is performed in the process chamber 201.

Nozzles 249a to 249c as first to third supply parts are installed in the process chamber 201 so as to penetrate a sidewall of the manifold 209. The nozzles 249a to 249c are each made of a heat resistant material such as, e.g., quartz or SiC. The nozzles 249a to 249c will also be referred to as first to third nozzles. Gas supply pipes 232a to 232c are connected to the nozzles 249a to 249c, respectively. The nozzles 249a to 249c are different nozzles, in which each of the nozzles 249b and 249c is installed adjacent to the nozzle 249a disposed therebetween.

Mass flow controllers (MFCs) 241a to 241c, which are flow rate controllers (flow rate control parts), and valves 243a to 243c, which are opening/closing valves, are installed at the gas supply pipes 232a to 232c sequentially from the corresponding upstream sides of gas flow, respectively. A gas supply pipe 232d is connected to the gas supply pipe 232a at the downstream side of the valve 243a. A gas supply pipe 232e is connected to the gas supply pipe 232b at the downstream side of the valve 243b. MFCs 241d and 241e and valves 243d and 243e are respectively installed at the gas supply pipes 232d and 232e sequentially from the corresponding upstream sides of gas flow. The gas supply pipes 232a to 232e are each made of a metal material such as, e.g., stainless steel (SUS) or the like.

Figure 2:
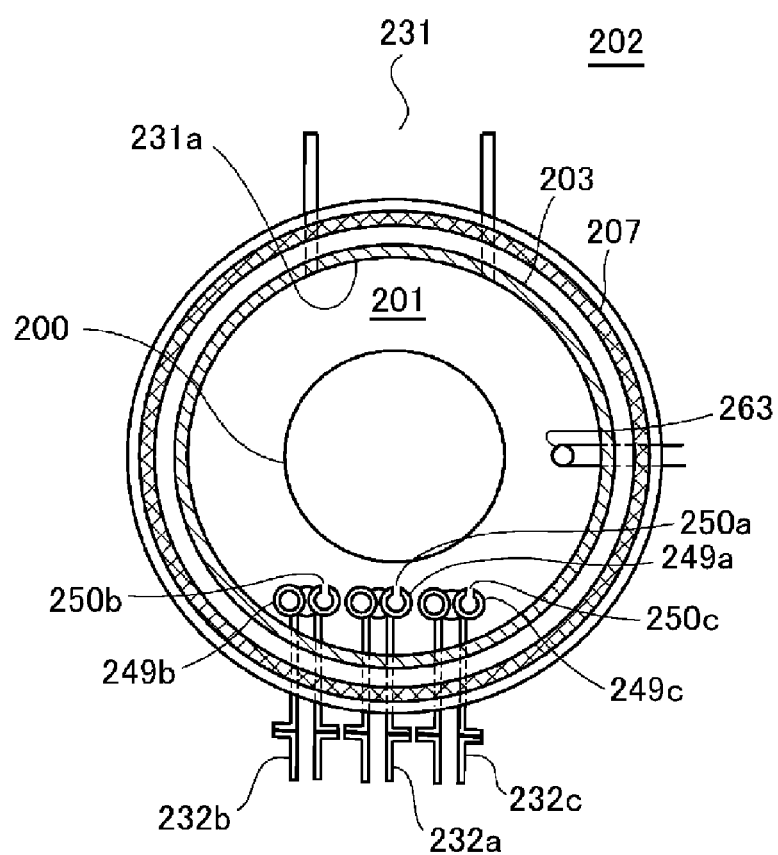
FIG. 2 is a schematic configuration diagram of a vertical type process furnace of the substrate processing apparatus suitably used in embodiments of the present disclosure, in which a portion of the process furnace is shown in a cross sectional view taken along line A-A in FIG. 1.

As illustrated in FIG. 2, the nozzles 249a to 249c are installed in a space with an annular plan-view shape between the inner wall of the reaction tube 203 and the wafers 200 so as to extend along a stacking direction of the wafers 200 from a lower portion of the inner wall of the reaction tube 203 to an upper portion of the inner wall of the reaction tube 203. Specifically, the nozzles 249a to 249c are installed at a lateral side of a space (hereinafter, referred to as a wafer arrangement region) in which the wafers 200 are arranged, namely in a region which horizontally surrounds the wafer arrangement region, so as to extend along the wafer arrangement region. The nozzle 249a is disposed to face an exhaust port 231a as described hereinbelow on a straight line in plan view with the centers of the wafers 200 carried into the process chamber 201 interposed therebetween. The nozzles 249b and 249c are disposed adjacent to the nozzle 249a so as to sandwich a straight line passing through the nozzle 249a and the exhaust port 231a therebetween. In other words, the nozzles 249b and 249c are disposed so as to sandwich the nozzle 249a at both sides with the nozzle 249a interposed therebetween, i.e., between both sides along the inner wall of the reaction tube 203 (outer peripheral portion of the wafers 200).

As illustrated in FIG. 6A, the nozzles 249a to 249c are each configured as a U-shaped nozzle (a U-turn nozzle or a return nozzle) having a portion (bending portion) bent in a reverse U-shape at the top of the nozzles 249a to 249c, i.e., at a position above the upper end of the wafer arrangement region. Gas injection holes 250a to 250c for supplying (injecting) a gas are installed at the side surfaces of the nozzles 249a to 249c along the wafer arrangement direction. The gas injection holes 250a to 250c may be formed in a plural number from one end side to the other end side in the wafer arrangement direction of the wafer arrangement region. Each of the gas injection holes 250a to 250c is opened to face the exhaust port 231a in plan view so as to allow a gas to be supplied toward the wafers 200. The shapes of the gas injection holes 250a to 250c viewed from the wafer arrangement region side are circular. The aperture areas (hole diameters) of the gas injection holes 250a to 250c are set equal in size from one end side to the other end side in the wafer arrangement direction of the wafer arrangement region. The aperture area (hole diameter) of the gas injection hole 250a is set equal to or smaller than the aperture area (hole diameter) of the gas injection hole 250b and is set equal to or smaller than the aperture area (hole diameter) of the gas injection hole 250c.

A precursor (precursor gas), for example, a halosilane-based gas containing silicon (Si), which is a main element constituting a film to be formed, and a halogen element is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane-based gas is a silane-based gas having a halogen group. The halogen group contains a halogen element such as chlorine (Cl), fluorine (F), bromine (Br), iodine (I), or the like. As the halosilane-based gas, it may be possible to use, for example, a precursor gas containing Si and Cl, i.e., a chlorosilane-based gas. The chlorosilane-based gas acts as a Si source. As the chlorosilane-based gas, it may be possible to use, for example, a dichlorosilane ($SiH_2Cl_2$, abbreviation: DCS) gas.

A reactant (reaction gas), for example, a nitrogen (N)-containing gas, is supplied from the gas supply pipe 232b into the process chamber 201 via the MFC 241b, the valve 243b, and the nozzle 249b. The N-containing gas acts as a nitriding source (a nitriding agent or a nitriding gas), i.e., a N source. As the N-containing gas, it may be possible to use, for example, an ammonia ($NH_3$) gas which is a hydrogen nitride-based gas.

An inert gas, for example, a nitrogen ($N_2$) gas, is supplied from the gas supply pipes 232d and 232e into the process chamber 201 via the MFCs 241d and 241e, the valves 243d and 243e, the gas supply pipes 232a and 232b, and the nozzles 249a and 249b. Furthermore, an inert gas, for example, the $N_2$ gas, is supplied from the gas supply pipe 232c into the process chamber 201 via the MFC 241c, the valve 243c, and the nozzle 249c. The $N_2$ gas acts as a pressure-regulating gas for regulating an internal pressure of the nozzles 249a to 249c, and also acts as a purge gas, a carrier gas, or a dilution gas.

A precursor gas supply system mainly includes the gas supply pipe 232a, the MFC 241a, and the valve 243a. A reaction gas supply system mainly includes the gas supply pipe 232b, the MFC 241b, and the valve 243b. An inert gas supply system mainly includes the gas supply pipes 232d, 232e and 232c, the MFCs 241d, 241e and 241c, and the valves 243d, 243e and 243c.

The decomposition amount of the precursor gas in the nozzle 249a is controlled not only by the internal temperature of the nozzle 249a but also by the internal pressure of the nozzle 249a. From that the internal pressure of the nozzle 249a is affected by the aperture area (hole diameter) of the gas injection hole 250a installed at the nozzle 249a, the nozzle 249a and the gas injection hole 250a may be regarded as being included in the aforementioned decomposition unit. In addition, from that the internal pressure of the nozzle 249a is affected by the flow rate of the precursor gas or the inert gas supplied into the nozzle 249a, the precursor gas supply system that controls the supply of the precursor gas into the nozzle 249a and the inert gas supply system that controls the supply of the inert gas into 249a may be regarded as being included in the aforementioned decomposition unit.

One or all of various supply systems described above may be configured as an integrated supply system 248 in which the valves 243a to 243e, the MFCs 241a to 241e, and the like are integrated. The integrated supply system 248 is connected to each of the gas supply pipes 232a to 232e so that a supply operation of various kinds of gases into the gas supply pipes 232a to 232e, i.e., an opening/closing operation of the valves 243a to 243e, a flow-rate-adjusting operation by the MFCs 241a to 241e, or the like, is controlled by a controller 121 which will be described below. The integrated supply system 248 is configured as an integral type or division type integrated unit, and is also configured so that it is detachable from the gas supply pipes 232a to 232e or the like, so as to perform maintenance, replacement, expansion or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas injection holes 250a to 250c) in plan view with the wafers 200 interposed therebetween. The exhaust port 231a may be installed along the wafer arrangement region from the lower portion of the sidewall of the reaction tube 203 to the upper portion of the sidewall of the reaction tube 203. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an APC (auto pressure controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while the vacuum pump 246 is operated and so that the internal pressure of the process chamber 201 can be adjusted by adjusting an opening degree of the APC valve 244 based on pressure information detected by the pressure sensor 245 while the vacuum pump 246 is operated. An exhaust system mainly includes the exhaust pipe 231, the APC valve 244, and the pressure sensor 245. The vacuum pump 246 may be regarded as being included in the exhaust system. Furthermore, the decomposition amount of the precursor gas in the process chamber 201 is controlled not only by the internal temperature of the process chamber 201 but also by the internal pressure of the process chamber 201. Therefore, the APC valve 244 may be regarded as being included in the aforementioned decomposition unit.

A seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate a boat 217, which will be described below, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 210 into and from the process chamber 201 by moving the seal cap 219 up and down. A shutter 219s as a furnace opening cover capable of hermetically seal the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed at an upper surface of the shutter 219s. An opening/closing operation (an up-down movement operation or a rotational movement operation) of the shutter 219s is controlled by a shutter-opening/closing mechanism 115s.

The boat 217 serving as a substrate support is configured to support the plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat-insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
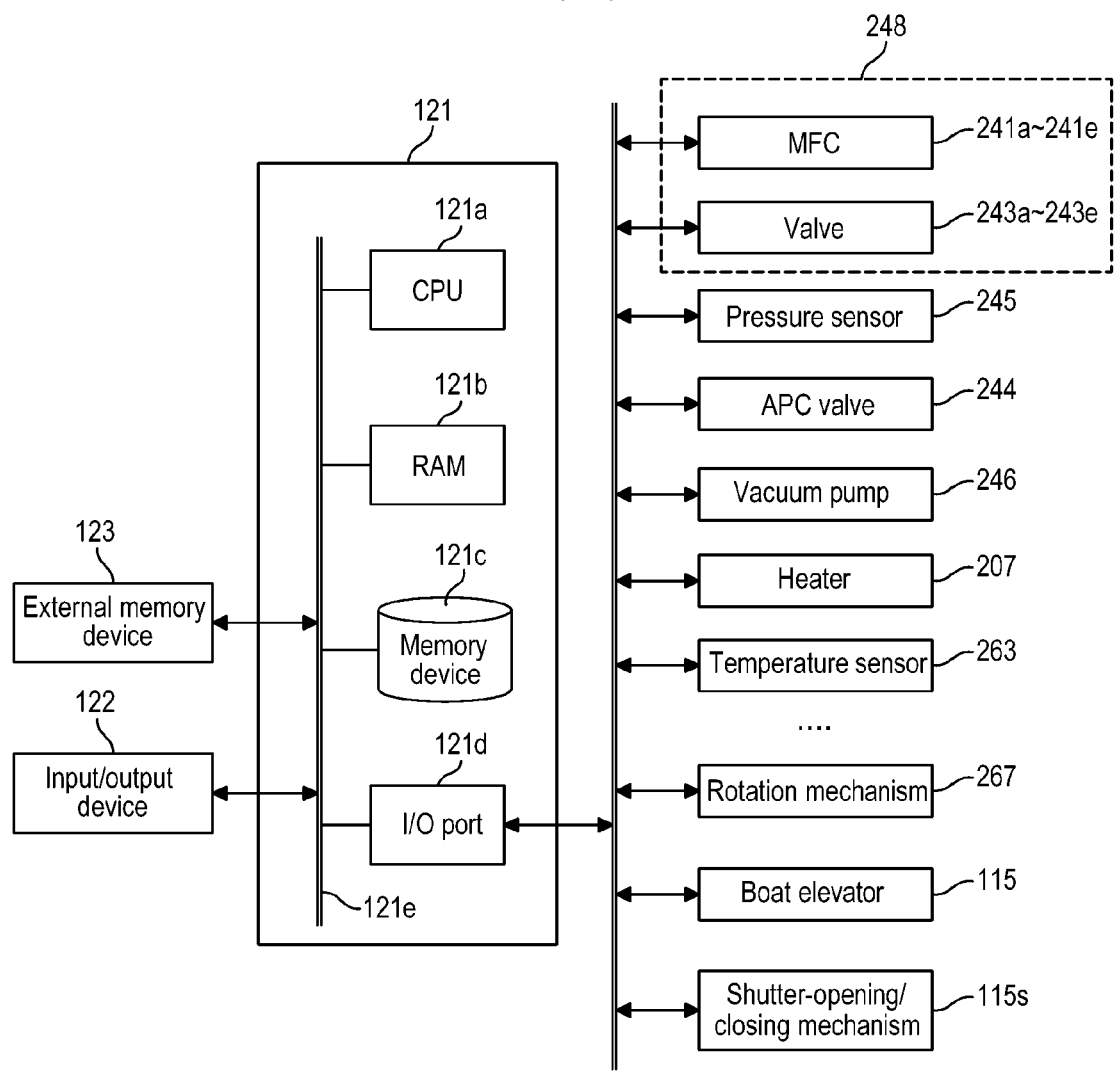
FIG. 3 is a schematic configuration diagram of a controller of the substrate processing apparatus suitably used in one or more embodiments of the present disclosure, in which a control system of the controller is shown in a block diagram.

As illustrated in FIG. 3, the controller 121, which is a control part (control means), may be configured as a computer including a CPU (central processing unit) 121a, a RAM (random access memory) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a HDD (hard disk drive), or the like. A control program for controlling operations of a substrate processing apparatus, a process recipe for specifying sequences and conditions of substrate processing as described hereinbelow, or the like is readably stored in the memory device 121c. The process recipe is combined for causing the controller 121 to execute each sequence in the substrate processing, as described hereinbelow, to obtain a predetermined result, and functions as a program. Hereinafter, the process recipe, the control program, and the like will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data, or the like read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter-opening/closing mechanism 115s, and the like, as described above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow-rate-adjusting operation of various kinds of gases by the MFCs 241a to 241e, the opening/closing operation of the valves 243a to 243e, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operation of rotating the boat 217 and adjusting the rotation speed of the boat 217 by the rotation mechanism 267, the operation of moving the boat 217 up and down by the boat elevator 115, the operation of opening and closing the shutter 219s with the shutter-opening/closing mechanism 115s, and the like.

The controller 121 may be configured by installing, on the computer, the aforementioned program stored in an external memory device 123. The external memory device 123 may include, for example, a magnetic disc such as a HDD, an optical disc such as a CD, a magneto-optical disc such as a MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate-Processing Process

A substrate-processing sequence example of forming a film on a wafer 200 as a substrate using the aforementioned substrate processing apparatus, i.e., a film-forming sequence example, which is one of the processes for manufacturing a semiconductor device, will be described with reference to FIG. 4. In the following descriptions, the operations of the respective parts constituting the substrate processing apparatus are controlled by the controller 121.

Figure 4:
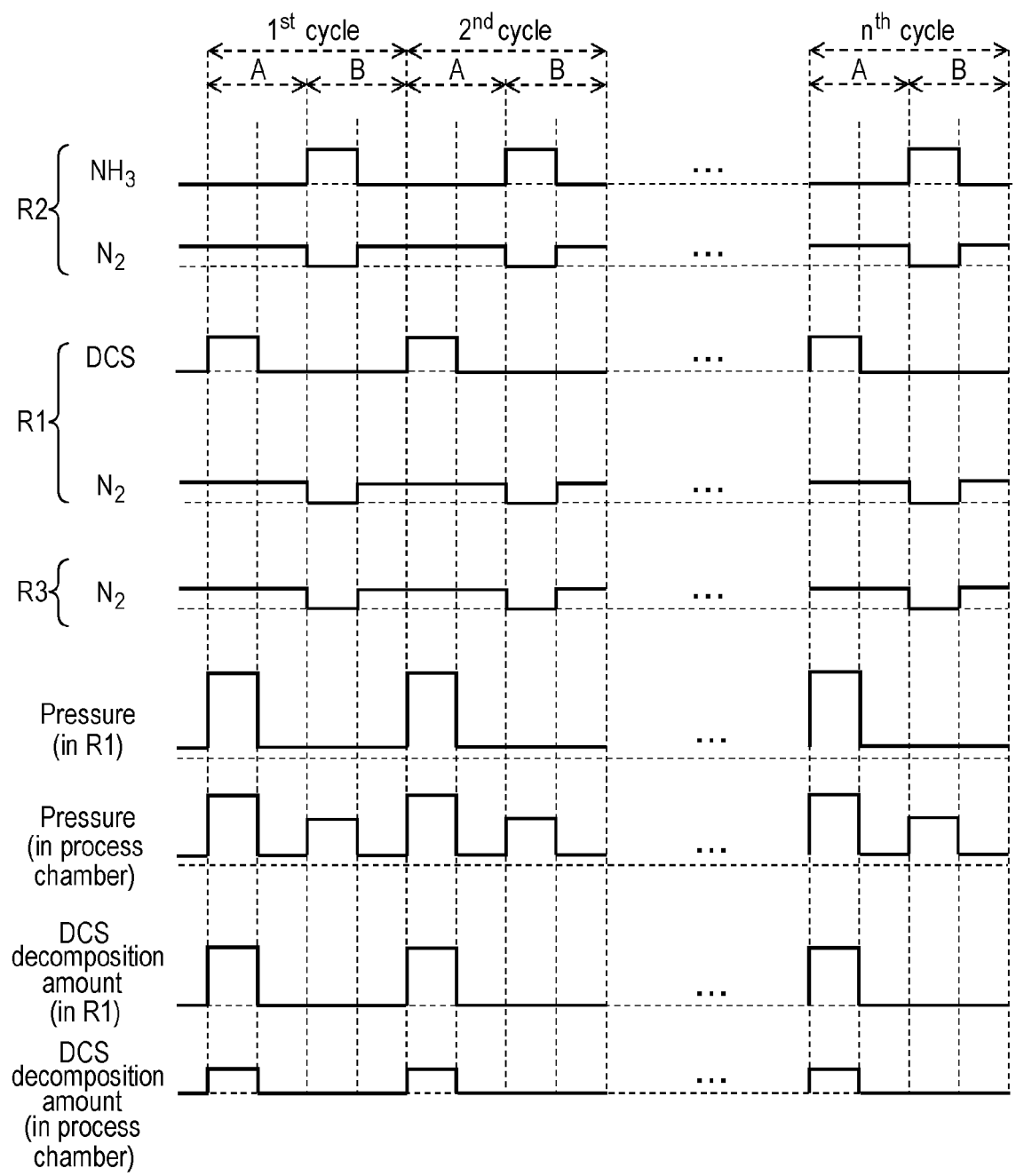
FIG. 4 is a diagram illustrating a film-forming sequence according to first embodiments of the present disclosure.

In the film-forming sequence illustrated in FIG. 4, a cycle which non-simultaneously performs step A of supplying the DCS gas as a precursor gas from the nozzle 249a as the first supply part to the wafer 200 in the process chamber 201; and step B of supplying the NH$_3$ gas as a reaction gas from the nozzle 249b as the second supply part (second supplier) to the wafer 200 in the process chamber 201 is implemented a predetermined number of times (n times, where n is an integer of 1 or larger) to form a film containing Si and N, i.e., a silicon nitride film (SiN film), as a film on the wafer 200.

Furthermore, when performing the film-forming sequence illustrated in FIG. 4, in step A, the DCS gas is decomposed in the nozzle 249a and in the process chamber 201 to generate an intermediate and supply the intermediate to the wafer 200, and at that time, a decomposition amount of the DCS gas in the nozzle 249a is set larger than a decomposition amount of the DCS gas in the process chamber 201.

In FIG. 4, for the sake of convenience, execution periods of steps A and B are denoted as A and B, respectively. Furthermore, in the present disclosure and FIG. 4, the nozzles 249a to 249c are denoted as R1 to R3, respectively, for the sake of convenience. The execution periods of the respective steps and the denotations of the respective nozzles are similar in FIG. 5 which illustrates a gas supply sequence of other embodiments as described hereinbelow.

In the present disclosure, for the sake of convenience, the film-forming sequence illustrated in FIG. 4 may be denoted as follows. The same denotation will be used in other embodiments as described hereinbelow.

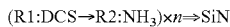

(R1:DCS→R2:NH$_3$)×n⇒SiN

When the term "wafer" is used herein, it may refer to a wafer itself or a laminated body of a wafer and a predetermined layer or film formed over the surface of the wafer. In addition, when the phrase "a surface of a wafer" is used herein, it may refer to a surface of a wafer itself or a surface of a predetermined layer or the like formed over a wafer. Furthermore, in the present disclosure, the expression "a predetermined layer is formed over a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

The plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (processing pressure). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature (processing temperature). In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Film-Forming Step)

Next, the following steps A and B are sequentially performed.

[Step A]

At this step, the DCS gas is supplied to the wafer 200 in the process chamber 201 (DCS gas supply step). Specifically, the valve 243a is opened to allow the DCS gas to flow through the gas supply pipe 232a. The flow rate of the DCS gas is adjusted by the MFC 241a. The DCS gas is supplied into the process chamber 201 via each of the plurality of gas injection holes 250a installed at the side surface of the nozzle 249a and is exhausted from the exhaust port 231a. At this time, the valves 243d, 243e, and 243c are opened to supply the N$_2$ gas into the process chamber 201 via the nozzles 249a to 249c. Furthermore, the flow rate of the N$_2$ gas supplied from each of the nozzles 249a to 249c is set at a flow rate equal to or smaller than the flow rate of the DCS gas supplied from the nozzle 249a. In addition, the supply of the N$_2$ gas from the nozzles 249a to 249c into the process chamber 201 may not be performed.

An example of a processing condition at this step may be described as follows:

Supply flow rate of DCS gas: 0.001 to 3 slm, or 0.01 to 1.5 slm in some embodiments Supply flow rate of N$_2$ gas (for each of R1 to R3): 0 to 3 slm, or 0 to 1.5 slm in some embodiments Supply time of each gas: 1 to 300 seconds, 2 to 120 seconds in some embodiments, or 5 to 60 seconds in some embodiments Processing temperature: 500 to 850 degrees C., or 550 to 700 in some embodiments Processing pressure: 1 to 4,666 Pa, or 133 to 3,999 Pa in some embodiments.

In the present disclosure, the expression of the numerical range such as "500 to 850 degrees C." may mean that a lower limit value and an upper limit value are included in that range. Therefore, for example, "500 to 850 degrees C." may mean "500 degrees C. or higher and 850 degrees C. or lower". The same applies to other numerical ranges.

At the DCS gas supply step, the DCS gas can be thermally decomposed in each of the nozzle 249a and the process chamber 201 to generate a partially decomposed DCS material ($SiH_xCl_y$), i.e., an intermediate.

In the present embodiments, the decomposition rate (decomposition speed) of the DCS gas in the nozzle 249a is set higher than the decomposition rate (decomposition speed) of the DCS gas in the process chamber 201. That is, the decomposition amount of the DCS gas in the nozzle 249a is set larger than the decomposition amount of the DCS gas in the process chamber 201. In other words, the generation rate (generation speed) of the intermediate in the nozzle 249a is set higher than the generation rate (generation speed) of the intermediate in the process chamber 201. That is, the generation amount of the intermediate in the nozzle 249a is set larger than the generation amount of the intermediate in the process chamber 201.

The decomposition amount of DCS gas in the nozzle 249a, i.e., the generation amount of the intermediate, tends to increase as the internal pressure of the nozzle 249a increases. In the present embodiments, by setting the aperture area (hole diameter) of the gas injection hole 250a equal to or smaller than the aperture area (hole diameter) of the gas injection hole 250b, or by setting the aperture area (hole diameter) of the gas injection hole 250a equal to or smaller than the aperture area (hole diameter) of the gas injection hole 250b and equal to or smaller than the aperture area (hole diameter) of the gas injection hole 250c in some embodiments, it is possible to appropriately increase the internal pressure of the nozzle 249a when using the nozzle 249a under the aforementioned processing condition. Furthermore, by setting the aperture area (hole diameter) of the gas injection hole 250a smaller than the aperture area (hole diameter) of the gas injection hole 250b, or by setting the aperture area (hole diameter) of the gas injection hole 250a smaller than the aperture area (hole diameter) of the gas injection hole 250b and smaller than the aperture area (hole diameter) of the gas injection hole 250c in some embodiments, it is possible to appropriately increase the internal pressure of the nozzle 249a when using the nozzle 249a under the aforementioned processing condition. In any of these cases, since the internal pressure of the nozzle 249a can be set higher than the internal pressure of the process chamber 201, it is possible to generate an appropriate pressure difference between the interior of the nozzle 249a and the interior of the process chamber 201. Thus, a CVD reaction can occur in the nozzle 249a to promote the decomposition of the DCS gas in the nozzle 249a, i.e., the generation of an intermediate, thereby creating the aforementioned state. The aperture area (hole diameter) of the gas injection hole 250a installed at the nozzle 249a can be said to be such an aperture area (hole diameter) that the decomposition amount, the decomposition rate, and the decomposition speed (the generation amount, the generation rate, and the generation speed of the intermediate) of the DCS gas in the nozzle 249a at the DCS gas supply step become at least in one of the aforementioned states.

By supplying the DCS gas containing an intermediate to the wafer 200, a Si-containing layer containing Cl is formed over the outermost surface of wafer 200. The Si-containing layer containing Cl is formed by physisorbing DCS, chemisorbing or depositing an intermediate on the outermost surface of the wafer 200, or pyrolyzing DCS or an intermediate to allow Si to be deposited thereon. The Si-containing layer containing Cl may contain an adsorption layer (a physisorption layer or a chemisorption layer) of DCS or an intermediate, may contain a deposition layer of an intermediate, or may contain a Si layer containing Cl (a deposition layer of Si). In the present disclosure, the Si-containing layer containing Cl will be simply referred to as a Si-containing layer.

Furthermore, at the DCS gas supply step, it is desirable that the internal pressure of the process chamber 201 be set equal to or higher than the internal pressure of the process chamber 201 at the $NH_3$ gas supply step of step B as described hereinbelow, and it is more desirable that the internal pressure of the process chamber 201 be set higher than the internal pressure of the process chamber 201 at the $NH_3$ gas supply step of step B.

After the Si-containing layer is formed, the valve 243a is closed to stop the supply of the DCS gas into the process chamber 201. Then, the interior of the process chamber 201 is vacuum-exhausted and the gas or the like, which remains within the process chamber 201, is removed from the interior of the process chamber 201 (purge step). At this time, the $N_2$ gas is supplied from the respective nozzles 249a to 249c into the process chamber 201. The $N_2$ gas acts as a purge gas.

As the precursor gas, it may be possible to use, in addition to the DCS gas, a chlorosilane-based gas such as a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas, or the like. This also applies to other embodiments as described hereinbelow.

As the inert gas, it may be possible to use, in addition to the $N_2$ gas, a rare gas such as an Ar gas, a He gas, a Ne gas, or a Xe gas. This also applies to step B or other embodiments as described hereinbelow.

[Step B]

After step A is completed, the $NH_3$ gas is supplied to the wafer 200 in the process chamber 201, i.e., the Si-containing layer formed over the wafer 200 ($NH_3$ gas supply step). Specifically, the valve 243b is opened to allow the $NH_3$ gas to flow through the gas supply pipe 232b. The flow rate of the $NH_3$ gas is adjusted by the MFC 241b. The $NH_3$ gas is supplied into the process chamber 201 via each of the plurality of gas injection holes 250b installed at the side surface of the nozzle 249b and is exhausted from the exhaust port 231a. At this time, the $NH_3$ gas is supplied to the wafer 200. Simultaneously, at least one selected from the group of the valves 243d, 243e and 243c may be opened to supply the $N_2$ gas into the process chamber 201 via at least one selected from the group of the nozzles 249a to 249c.

An example of a processing condition at this step may be described as follows:

Supply flow rate of $NH_3$ gas: 1 to 20 slm

Supply flow rate of $N_2$ gas (for each of R1 to R3): 0 to 5 slm

Supply time of $NH_3$ gas: 1 to 120 seconds, or 1 to 60 seconds in some embodiments Processing pressure: 1 to 3,999 Pa, or 67 to 2,666 Pa in some embodiments.

Other processing conditions may be similar to the processing condition of step A.

By supplying the $NH_3$ gas to the wafer 200 under the aforementioned conditions, at least a portion of the Si-containing layer formed over the wafer 200 is nitrided (modified). By modifying the Si-containing layer, a layer containing Si and N, i.e., a SiN layer, is formed over the wafer 200. When the SiN layer is formed, an impurity such as Cl or the like contained in the Si-containing layer constitutes a gaseous substance containing at least Cl in the process of the modification reaction of the Si-containing layer by the $NH_3$ gas and is exhausted from the interior of the process chamber 201. Thus, the SiN layer becomes a layer having a smaller amount of impurity such as Cl or the like than the Si-containing layer.

After the SiN layer is formed, the valve 243b is closed to stop the supply of the $NH_3$ gas into the process chamber 201. Then, the gas or the like, which remains within the process chamber 201, is removed from the interior of the process chamber 201 according to the same processing procedures as those of the purge step of step A (purge step).

As the reaction gas, it may be possible to use, in addition to the $NH_3$ gas, for example, a hydrogen nitride-based gas such as a diazene ($N_2H_2$) gas, a hydrazine ($N_2H_4$) gas, a $N_3H_8$ gas, or the like. This also applies to other embodiments as described hereinbelow.

[Performing a Predetermined Number of Times]

A cycle which non-simultaneously, i.e., non-synchronously, performs steps A and B described above is implemented a predetermined number of times (n times, where n is an integer of 1 or larger), whereby the SiN film which has a predetermined composition and a predetermined thickness can be formed on the wafer 200. The aforementioned cycle may be repeated multiple times. That is, the thickness of the SiN layer formed when the aforementioned cycle is implemented once may be set smaller than a desired thickness, and the aforementioned cycle may be repeated multiple times until the thickness of the SiN film formed by laminating the SiN layer becomes equal to the desired thickness.

(After-Purge and Atmospheric Pressure Return)

After the film-forming step is completed, the $N_2$ gas is supplied from the respective nozzles 249a to 249c into the process chamber 201 and is exhausted from the exhaust pipe 231 via the exhaust port 231a. The $N_2$ gas acts as a purge gas. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). The processed wafers 200 are unloaded to the outside of the reaction tube 203 and are subsequently discharged from the boat 217 (wafer discharging).

(3) Effects According to the Present Embodiments

According to the present embodiments, one or more effects as set forth below may be achieved.

(a) Since an appropriate pressure difference can be generated between the interior of the nozzle 249a and the interior of the process chamber 201 by appropriately increasing the internal pressure of the nozzle 249a under the aforementioned processing conditions at the DCS gas supply step of step A, it is possible to set the decomposition amount of the DCS gas (generation amount of the intermediate) in the nozzle 249a larger than the decomposition amount of the DCS gas in the process chamber 201 (generation amount of the intermediate). As a result, it is possible to improve wafer in-plane refractive index uniformity (hereinafter, in-plane refractive index uniformity) of the SiN film formed on the wafer 200. This is considered to be because it is possible to improve wafer in-plane composition ratio uniformity (hereinafter, in-plane composition ratio uniformity) of the SiN film formed on the wafer 200 by controlling the decomposition amount of the DCS gas (generation amount of the intermediate) as described above.

The reason for this is that, in the conventional film-forming method, the intermediate may not reach the central portion of the wafer 200, whereby the ratio of Si to N in the SiN film in the central portion of the wafer 200 may be lower than the ratio of Si to N in the SiN film in the outer peripheral portion of the wafer 200. On the other hand, according to the present embodiments, the intermediate can reach not only to the outer peripheral portion of the wafer 200 but also to the central portion thereof by generating an appropriate pressure difference between the interior of the nozzle 249a and the interior of the process chamber 201 and controlling the decomposition amount of the DCS gas (generation amount of the intermediate) as described above. Thus, it is possible to make the ratio of Si to N in the SiN film formed on the wafer 200 equal between the outer peripheral portion and the central portion of the wafer 200, and to uniformize the composition ratio of the SiN film formed on the wafer 200 over the entire surface of the wafer. According to the present embodiments, for example, when forming a Si-rich SiN film on the wafer 200, it is possible to not only make the composition of the SiN film in the outer peripheral portion of the wafer 200 Si-rich but also make the composition of the SiN film in the central portion thereof Si-rich. Thus, it is possible to allow the SiN film formed on the wafer 200 to become a Si-rich film over the entire surface of the wafer.

(b) It is desirable that the aperture area (hole diameter) of the gas injection hole 250a of the nozzle 249a for supplying the precursor gas be set equal to or smaller than the aperture area (hole diameter) of the gas injection hole 250b of the nozzle 249b for supplying the reaction gas in some embodiments. By setting the aperture area (hole diameter) of the gas injection hole 250a equal to or smaller than the aperture area (hole diameter) of the gas injection hole 250b, it is possible to reliably increase the internal pressure of the nozzle 249a at the DCS gas supply step. Thus, it is possible to reliably achieve the aforementioned effects. Furthermore, it is more desirable that the aperture area (hole diameter) of the gas injection hole 250a of the nozzle 249a for supplying the precursor gas be set smaller than the aperture area (hole diameter) of the gas injection hole 250b of the nozzle 249b for supplying the reaction gas in some embodiments. By setting the aperture area (hole diameter) of the gas injection hole 250a smaller than the aperture area (hole diameter) of the gas injection hole 250b, it is possible to more reliably increase the internal pressure of the nozzle 249a at the DCS gas supply step. Thus, it is possible to reliably achieve the aforementioned effects.

(c) It is desirable that the aperture area (hole diameter) of the gas injection hole 250a of the nozzle 249a for supplying the precursor gas be set equal to or smaller than the aperture area (hole diameter) of the gas injection holes 250b and 250c for the nozzles 249b and 249c for supplying other gases (the reaction gas and the inert gas) in some embodiments. By setting the aperture area (hole diameter) of the gas injection hole 250a equal to or smaller than the aperture area (hole diameter) of the gas injection hole 250b and equal to or smaller than the aperture area (hole diameter) of the gas injection hole 250c, it is possible to reliably increase the internal pressure of the nozzle 249a at the DCS gas supply step. Thus, it is possible to reliably achieve the aforementioned effects. In addition, it is more desirable that the aperture area (hole diameter) of the gas injection hole 250a of the nozzle 249a for supplying the precursor gas be set smaller than the aperture area (hole diameter) of the gas injection holes 250b and 250c of the nozzles 249b and 249c for supplying other gases (the reaction gas and the inert gas) in some embodiments. By setting the aperture area (hole diameter) of the gas injection hole 250a smaller than the aperture area (hole diameter) of the gas injection hole 250b and smaller than the aperture area (hole diameter) of the gas injection hole 250c, it is possible to more reliably increase the internal pressure of the nozzle 249a at the DCS gas supply step. Thus, it is possible to reliably achieve the aforementioned effects.

(d) It is desirable that the internal pressure of the process chamber 201 at the DCS gas supply step of step A be set equal to or higher than the internal pressure (at least a pressure at which nitriding of the Si-containing layer is properly performed) of the process chamber 201 at the NH$_3$ gas supply step of step B. By doing so, the pressure of a space with an annular plan-view shape is increased at the gap between the inner wall of the reaction tube 203 and the wafer 200 and the conductance of this space is lowered, thereby suppressing the flow of the DCS gas containing an intermediate downward from the gap. Thus, the intermediate can be efficiently supplied to the central portion of the wafer 200. As a result, it is possible to improve the in-plane refractive index uniformity and in-plane film thickness uniformity of the SiN film formed on the wafer 200. Furthermore, by setting the internal pressure of the process chamber 201 at the DCS gas supply step of step A higher than the internal pressure (at least a pressure at which nitriding of the Si-containing layer is properly performed) of the process chamber 201 at the NH$_3$ gas supply step of step B, it is possible to more reliably achieve the aforementioned effects.

(e) According to the present embodiments, the SiN film having excellent electrical characteristics and wafer in-plane film thickness uniformity (hereinafter, in-plane film thickness uniformity), small surface roughness (the surface is smooth), and excellent in-plane refractive index uniformity can be formed on the wafer 200. Furthermore, according to the present embodiments, it is not necessary to expand the arrangement interval (pitch) of the wafers 200 in the wafer arrangement region in order to obtain these characteristics. Therefore, it is possible to avoid a reduction in the productivity of the substrate processing and an increase in cost.

(f) The effects mentioned above can be similarly achieved in the case where the aforementioned precursor gas other than the DCS gas is used, or in the case where the aforementioned reaction gas other than the NH$_3$ gas is used, or in the case where the aforementioned inert gas other than the N$_2$ gas is used.

Second Embodiments

Next, second embodiments of the present disclosure will be described with reference to FIG. 5.

Figure 5:
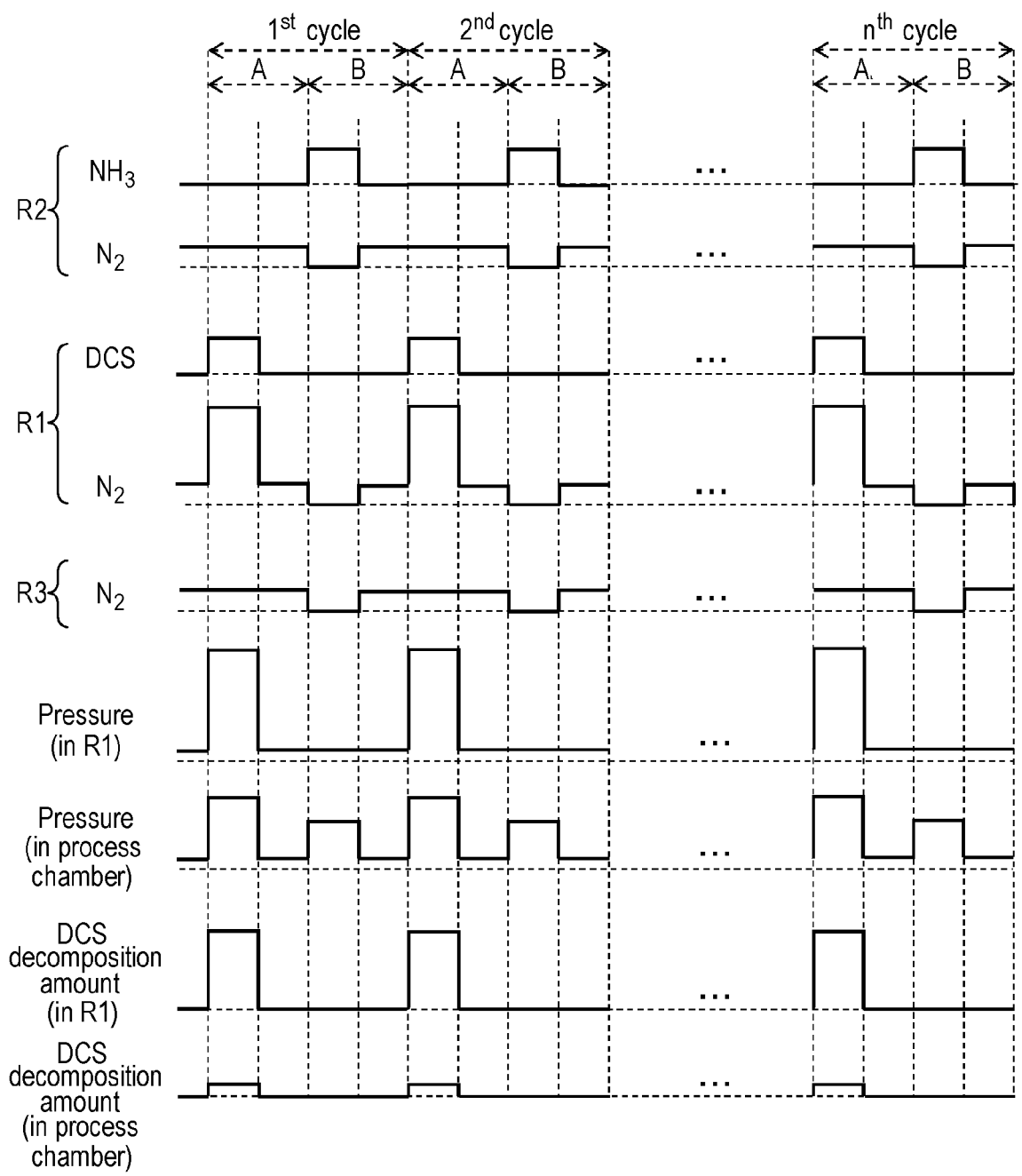
FIG. 5 is a diagram illustrating a film-forming sequence according to second embodiments of the present disclosure.

In the present embodiments, as in the film-forming sequence illustrated in FIG. 5, at the DCS gas supply step of step A, the N$_2$ gas is supplied from the nozzle 249a to the wafer 200 and the flow rate of the N$_2$ gas supplied from the nozzle 249a is set larger than the flow rate of the DCS gas supplied from the nozzle 249a. The rest may be similar to that of the first embodiments described above.

An example of a processing condition at the DCS gas supply step of step A of the present embodiments may be described as follows:

Supply flow rate of DCS gas: 0.001 to 3 slm, or 0.01 to 1.5 slm in some embodiments Supply flow rate of N$_2$ gas (R1): 5 to 40 slm, or 10 to 30 slm in some embodiments Supply flow rate of N$_2$ gas (R2 and R3): 0 to 3 slm.

Other processing conditions at step A may be similar to the processing condition at step A of the first embodiments described above.

The processing procedures and processing condition at step B may be similar to the processing procedures and processing condition at step B of the first embodiments described above.

According to the present embodiments, by setting the flow rate of the N$_2$ gas supplied from the nozzle 249a, i.e., the N$_2$ gas acting as a pressure regulating gas, larger than the flow rate of the DCS gas supplied from the nozzle 249a at the DCS gas supply step, it is possible to increase the internal pressure of the nozzle 249a and to promote the decomposition of the DCS gas in the nozzle 249a. As a result, it is possible to more reliably increase the decomposition amount of the DCS gas (generation amount of the intermediate) in the nozzle 249a than the decomposition amount of the DCS gas in the process chamber 201 (generation amount of the intermediate). Thus, it is possible to reliably improve the in-plane refractive index uniformity of the SiN film formed on the wafer 200.

Furthermore, according to the present embodiments, by setting the flow rate of the N$_2$ gas supplied from the nozzle 249a, i.e., the N$_2$ gas acting as a carrier gas, larger than the flow rate of the DCS gas supplied from the nozzle 249a at the DCS gas supply step, the DCS gas containing an intermediate flowing from the nozzle 249a can be extruded toward the wafer 200 to promote the supply of the intermediate to the central portion of the wafer 200. Further, this extrusion effect makes it possible to suppress the flow of the DCS gas containing an intermediate downward from the gap between the inner wall of the reaction tube 203 and the wafer 200, and to efficiently perform the supply of the intermediate to the central portion of the wafer 200. In addition, it is possible to further suppress the flow of the DCS gas containing an intermediate downward from the gap by increasing the pressure of a space with an annular plan-view shape at the gap between the inner wall of the reaction tube 203 and the wafer 200 and reducing the conductance of this space. Thus, it is possible to more reliably improve the in-plane refractive index uniformity of the SiN film formed on the wafer 200. Further, it is possible to more reliably improve the in-plane film thickness uniformity of the SiN film formed on the wafer 200.

Furthermore, by controlling the balance of the flow rates of the respective gases so as to set the flow rate of the N$_2$ gas supplied from the nozzle 249a larger than the flow rate of the DCS gas supplied from the nozzle 249a and larger than the flow rate of the N$_2$ gas supplied from each of the nozzle 249b and the nozzle 249c at the DCS gas supply step, it is possible to more reliably achieve the aforementioned effects.

In addition, by controlling the balance of the flow rates of the respective gases so as to set the flow rate of the N$_2$ gas supplied from the nozzle 249a larger than the flow rate of the DCS gas supplied from the nozzle 249a and larger than the total flow rate of the $N_2$ gas supplied from each of the nozzle 249b and the nozzle 249c at the DCS gas supply step, it is possible to even more reliably achieve the aforementioned effects.

Other Embodiments

While the embodiments of the present disclosure have been specifically described above, the present disclosure is not limited to the aforementioned embodiments but may be variously modified without departing from the spirit of the present disclosure.

For example, as illustrated in FIG. 6B, long nozzles configured to extend upward along the wafer arrangement direction from the lower portion of the inner wall of the reaction tube 203 to the upper portion thereof may be used as the nozzles 249a to 249c. Also, in the nozzles 249a to 249c illustrated in FIG. 6B, the gas injection holes 250a to 250c are formed in a plural number from one end side to the other end side in the wafer arrangement direction of the wafer arrangement region, and the respective aperture areas (hole diameters) are set equal in size. Also, in this case, the aperture area (hole diameter) of the gas injection hole 250a is set equal to or smaller than the aperture area (hole diameter) of the gas injection hole 250b and equal to or smaller than the aperture area (hole diameter) of the gas injection hole 250c. Also, in this case, it is desirable that the aperture area (hole diameter) of the gas injection hole 250a be set smaller than the aperture area (hole diameter) of the gas injection hole 250b, and further smaller than the aperture area (hole diameter) of the gas injection hole 250c in some embodiments. Even in these cases, the same effects as those of the aforementioned embodiments may be achieved.

Furthermore, for example, two or more nozzles for supplying the DCS gas may be installed to supply the DCS gas via the two or more nozzles at the DCS gas supply step. Even in this case, the same effects as those of the aforementioned embodiments may be achieved. In addition, according to this case, since the supply amount of the DCS gas can be doubled or more compared with the case where the DCS gas is supplied via one nozzle, the supply amount of the intermediate to the central portion of the wafer 200 can be doubled or more. Thus, it is possible to enhance the effects achieved in the aforementioned embodiments.

Furthermore, as the precursor gas, it may be possible to use, in addition to the chlorosilane-based gas, for example, an aminosilane-based gas such as a tris(dimethylamino) silane $(SiH[N(CH_3)_2]_3$, abbreviation: 3DMAS) gas, a bis(diethylamino)silane $(SiH_2[N(C_2H_5)_2]_2$, abbreviation: BDEAS) gas, or the like. Even in this case, the same effects as those of the aforementioned embodiments may be achieved.

Moreover, as the reaction gas, it may be possible to use, for example, a carbon (C)-containing gas such as a propylene $(C_3H_6)$ gas, a gas containing N and C such as a triethylamine $((C_2H_5)_3N$, abbreviation: TEA) gas, a boron (B)-containing gas such as a trichloroborane $(BCl_3)$ gas, or an oxygen (O)-containing gas such as an oxygen $(O_2)$ gas, an ozone $(O_3)$ gas, a plasma-excited $O_2$ gas $(O_2^*)$, an $O_2$ gas+hydrogen $(H_2)$ gas or water vapor $(H_2O$ gas).

Furthermore, the present disclosure may be applied to a case where a film containing Si such as a silicon oxynitride film (SiON film), a silicon oxycarbide film (SiOC film), a silicon carbonitride film (SiCN film), a silicon oxycarbonitride film (SiOCN film), a silicon borocarbonitride film (SiBCN film), a silicon boronitride film (SiBN film), a silicon oxide film (SiO film), or the like is formed on the substrate according to the film-forming sequence illustrated below. The processing procedures and processing conditions when supplying the precursor gas and the reaction gas may be similar to, e.g., those used at each step of the aforementioned embodiments. Even in these cases, the same effects as those of the aforementioned embodiments may be achieved.

$(R1:DCS \rightarrow R2:NH_3 \rightarrow R3:O_2) \times n \Rightarrow SiON$ $(R1:DCS \rightarrow R2:TEA \rightarrow R3:O_2) \times n \Rightarrow SiOC(N)$ $(R1:DCS \rightarrow R2:C_3H_6 \rightarrow R3:NH_3) \times n \Rightarrow SiCN$ $(R1:DCS \rightarrow R2:C_3H_6 \rightarrow R3:NH_3 \rightarrow R3:O_2) \times n \Rightarrow SiOCN$ $(R1:DCS \rightarrow R2:C_3H_6 \rightarrow R2:BCl_3 \rightarrow R3:NH_3) \times n \Rightarrow SiBCN$ $(R1:DCS \rightarrow R2:BCl_3 \rightarrow R3:NH_3) \times n \Rightarrow SiBN$ $(R1:DCS \rightarrow R2:O_2+H_2) \times n \Rightarrow SiO$ Furthermore, the present disclosure may be applied to, e.g., a case where a film containing a metal element such as a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), a titanium oxide film (TiO film) or the like is formed on the substrate using a titanium tetrachloride $(TiCl_4)$ gas, a trimethyl aluminum $(Al(CH_3)_3$, abbreviation: TMA) gas or the like as the precursor gas and by the film-forming sequence illustrated below. The processing procedures and processing conditions when supplying the precursor gas and the reaction gas may be similar to, e.g., those used at each step of the aforementioned embodiments. Even in these cases, the same effects as those of the aforementioned embodiments may be achieved.

$(R1:TiCl_4 \rightarrow R2:NH_3) \times n \Rightarrow TiN$ $(R1:TiCl_4 \rightarrow R2:NH_3 \rightarrow R3:O_2) \times n \Rightarrow TiON$ $(R1:TiCl_4 \rightarrow R2:TMA \rightarrow R3:NH_3) \times n \Rightarrow TiAlCN$ $(R1:TiCl_4 \rightarrow R1:TMA) \times n \Rightarrow TiAlC$ $(R1:TiCl_4 \rightarrow R2:TEA) \times n \Rightarrow TiCN$ $(R1:TiCl_4 \rightarrow R2:H_2O) \times n \Rightarrow TiO$ Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the contents of substrate processing. Thus, it is possible for a single substrate processing apparatus to form films of different kinds, composition ratios, qualities and thicknesses with enhanced reproducibility. In addition, it is possible to reduce an operator's burden and to quickly start the processing while avoiding an operation error.

The recipes mentioned above are not limited to newly-prepared ones but may be prepared by, for example, modifying the existing recipes already installed in the substrate processing apparatus. When the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

Figure 7A:
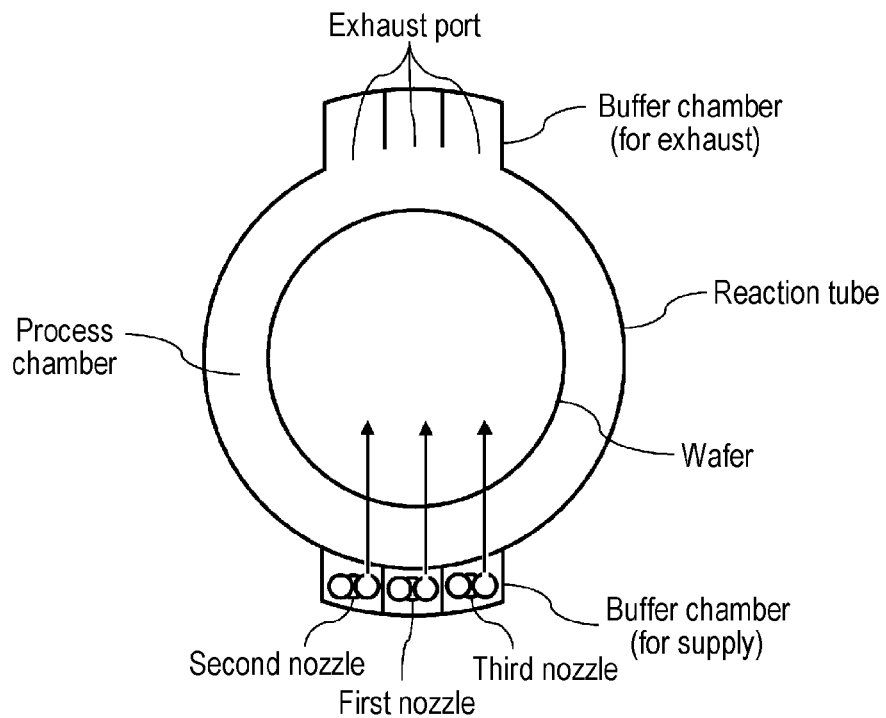
FIGS. 7A and 7B are schematic configuration diagrams of vertical type process furnaces of a substrate processing apparatus suitably used in other embodiments of the present disclosure, respectively.
Figure 7B:
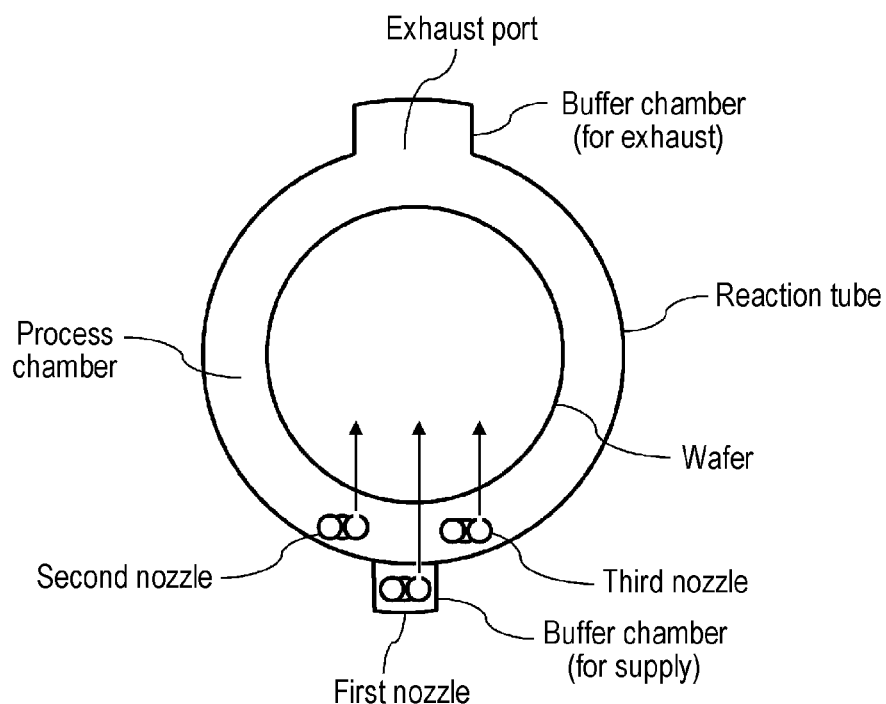

In the aforementioned embodiments, there have been described examples in which the first to third nozzles (nozzles 249a to 249c) as the first to third supply parts are installed in the process chamber along the inner wall of the reaction tube. However, the present disclosure is not limited to the aforementioned embodiments. For example, as illustrated in a cross sectional structure of a vertical type process furnace in FIG. 7A, a buffer chamber is installed at the sidewall of the reaction tube, and the first to third nozzles having the same configuration as the aforementioned embodiments may be installed in the buffer chamber in the same arrangement as that of the aforementioned embodiments. FIG. 7A illustrates an example in which a buffer chamber for supply and a buffer chamber for exhaust are installed at the sidewall of the reaction tube, and these buffer chambers are respectively arranged in opposite positions with the wafers interposed therebetween. In addition, each of the buffer chamber for supply and the buffer chamber for exhaust is installed so as to extend along the wafer arrangement region from the lower portion of the sidewall of the reaction tube to the upper portion thereof. Furthermore, FIG. 7A illustrates an example in which the buffer chamber for supply is partitioned into a plurality of (three) spaces, and each nozzle is disposed in each space. The arrangement of the three spaces of the buffer chamber may be similar to the arrangement of the first to third nozzles. The respective spaces in which the first to third nozzles are disposed may be referred to as first to third buffer chambers. The first nozzle and the first buffer chamber, the second nozzle and the second buffer chamber, and the third nozzle and the third buffer chamber may be regarded as a first supply part, a second supply part, and a third supply part (third supplier), respectively. In addition, for example, as illustrated in a cross sectional structure of a vertical type process furnace in FIG. 7B, the buffer chamber may be installed in the same arrangement as that of FIG. 7A, the first nozzle may be installed in the buffer chamber, and the second and third nozzles may be installed so as to sandwich a communication part of this buffer chamber with the process chamber therebetween along the inner wall of the reaction tube. The first nozzle and the buffer chamber, the second nozzle, and the third nozzle may be regarded as a first supply part, a second supply part, and a third supply part, respectively. The configurations other than the buffer chambers and the reaction tube described above with reference to FIGS. 7A and 7B may be similar to the configurations of the respective parts of the process furnace illustrated in FIG. 1. Even in the case of using these process furnaces, the same effects as those of the aforementioned embodiments may be achieved.

In the aforementioned embodiments, there have been described examples in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, substrate processing may be performed by the sequences and processing conditions similar to those of the aforementioned embodiments. Effects similar to those of the aforementioned embodiments above may be achieved. That is, the present disclosure may be applied to a case of using a substrate processing apparatus configured to exhaust a precursor gas supplied from the first supply part to the substrate from the exhaust port disposed in a position facing the first supply part at least in plan view with the substrate interposed therebetween. Further, the present disclosure may be applied to a case of using a substrate processing apparatus configured to supply a precursor gas and an inert gas to the substrate from the side of the substrate or to supply a reaction gas to the substrate from the side of the substrate.

The aforementioned embodiments may be appropriately combined with one another. The processing procedures and processing conditions at this time may be similar to, for example, the processing procedures and processing conditions of the aforementioned embodiments.

Embodiment Example

As an embodiment example (embodiment example 1), the SiN film was formed on a wafer using the substrate processing apparatus illustrated in FIG. 1 and by the film-forming sequence illustrated in FIG. 5. At the DCS gas supply step, the internal pressure of the process chamber at this time was set higher than the internal pressure of the process chamber at the $NH_3$ gas supply step by supplying the $N_2$ gas together with the DCS gas from the first supply part. Then, the processing conditions at the DCS gas supply step were set to conditions in which the decomposition amount of the DCS gas in the first supply part is larger than the decomposition amount of the DCS gas in the process chamber. Other processing conditions were set to predetermined conditions which fall within the processing condition range described in the second embodiments described above.

As comparative example 1, the SiN film was formed on a wafer by alternately repeating a step of supplying the DCS gas from the first supply part to the wafer and a step of supplying the $NH_3$ gas from the second supply part to the wafer using the substrate processing apparatus illustrated in FIG. 1. At the DCS gas supply step, the internal pressure of the process chamber at this time was set lower than the internal pressure of the process chamber at the $NH_3$ gas supply step by supplying the $N_2$ gas together with the DCS gas from the first supply part. Further, the processing conditions at the DCS gas supply step were set to predetermined conditions in which the decomposition amount of the DCS gas in the first supply part is equal to or smaller than the decomposition amount of the DCS gas in the process chamber. Furthermore, the flow rate of the $N_2$ gas supplied together with the DCS gas from the first supply part was set to $1/5$ to $1/10$ or less of the flow rate of the $N_2$ gas supplied together with the DCS gas from the first supply part in the embodiment example. Other processing procedures and processing conditions were set similar to the processing conditions in the embodiment example.

As comparative example 2, the SiN film was formed on a wafer by alternately repeating a step of supplying a DCS gas from the first supply part to the wafer and a step of supplying the $NH_3$ gas from the second supply part to the wafer using the substrate processing apparatus illustrated in FIG. 1. At the DCS gas supply step, the supply of the $N_2$ gas from the first supply part was not performed, and the internal pressure of the process chamber at this time was set lower than the internal pressure of the process chamber at the NH$_3$ gas supply step. Then, the processing conditions at the DCS gas supply step were set to predetermined conditions in which the decomposition amount of the DCS gas in the first supply part is smaller than the decomposition amount of the DCS gas in the process chamber. Other processing procedures and processing conditions were set similar to the processing conditions in the embodiment example.

Then, in-plane refractive index uniformities (R. I. Range) and in-plane film thickness uniformities (WiW) of the SiN films formed in embodiment example 1 and comparative examples 1 and 2 were measured. These measurement results are illustrated in FIG. 8. Both R. I. Range and WiW [%] mean that the wafer in-plane uniformity is higher (uniform) as the values are smaller.

As illustrated in FIG. 8, it can be seen that the values of R. I. Range and WiW are both smaller in embodiment example 1 than in comparative examples 1 and 2. That is, it can be seen that it is possible to improve the in-plane refractive index uniformity and the in-plane film thickness uniformity of the SiN film formed on the wafer by performing the DCS gas supply step under a condition in which the decomposition amount of the DCS gas in the first supply part is larger than the decomposition amount of the DCS gas in the process chamber.

According to the present disclosure in some embodiments, it is possible to improve film quality uniformity of a film formed on the substrate in a plane of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate in a process chamber by performing a cycle a predetermined number of times, the cycle including non-simultaneously performing:
    (a) supplying a precursor gas from a first supplier to the substrate in the process chamber; and
    (b) supplying a reaction gas from a second supplier to the substrate in the process chamber,
    wherein in (a), an intermediate is generated by decomposing the precursor gas in the first supplier and in the process chamber, the intermediate is supplied to the substrate, and a decomposition amount of the precursor gas in the first supplier is set larger than a decomposition amount of the precursor gas in the process chamber,
    wherein in (a), an inert gas is supplied from each of the first supplier, the second supplier, and a third supplier, which are different from one another, to the substrate, and the second supplier and the third supplier are disposed to sandwich the first supplier therebetween, and
    wherein in (a), a flow rate of the inert gas supplied from the first supplier is set larger than a flow rate of the precursor gas supplied from the first supplier, and is set larger than a flow rate of each of the inert gases supplied from the second supplier and the third supplier.

2. The method according to claim 1, wherein in (a), a decomposition rate of the precursor gas in the first supplier is set larger than a decomposition rate of the precursor gas in the process chamber.

3. The method according to claim 1, wherein in (a), a decomposition speed of the precursor gas in the first supplier is set higher than a decomposition speed of the precursor gas in the process chamber.

4. The method according to claim 1, wherein in (a), a generation amount of the intermediate in the first supplier is set larger than a generation amount of the intermediate in the process chamber.

5. The method according to claim 1, wherein in (a), a generation rate of the intermediate in the first supplier is set higher than a generation rate of the intermediate in the process chamber.

6. The method according to claim 1, wherein in (a), a generation speed of the intermediate in the first supplier is set higher than a generation speed of the intermediate in the process chamber.

7. The method according to claim 1, wherein an aperture area of a gas injection hole installed at the first supplier is set to an aperture area which allows the decomposition amount of the precursor gas in the first supplier to be set larger than the decomposition amount of the precursor gas in the process chamber in (a).

8. The method according to claim 1, wherein an aperture area of a gas injection hole installed at the first supplier is set equal to or smaller than an aperture area of a gas injection hole installed at the second supplier.

9. The method according to claim 1, wherein an aperture area of a gas injection hole installed at the first supplier is set smaller than an aperture area of a gas injection hole installed at the second supplier.

10. The method according to claim 1,
    wherein an aperture area of a gas injection hole installed at the first supplier is set equal to or smaller than an aperture area of a gas injection hole installed at each of the second supplier and the third supplier.

11. The method according to claim 1,
    wherein an aperture area of a gas injection hole installed at the first supplier is set smaller than an aperture area of a gas injection hole installed at each of the second supplier and the third supplier.

12. The method according to claim 1,
    wherein the flow rate of the inert gas supplied from the first supplier is set larger than a total flow rate of the inert gas supplied from each of the second supplier and the third supplier.

13. The method according to claim 1, wherein an internal pressure of the process chamber in (a) is set equal to or higher than an internal pressure of the process chamber in (b).

14. The method according to claim 1, wherein an internal pressure of the process chamber in (a) is set higher than an internal pressure of the process chamber in (b).

15. The method according to claim 1, wherein in (a), the precursor gas supplied to the substrate is exhausted from an exhaust port disposed at a position facing the first supplier at least in plan view with the substrate interposed between the first supplier and the exhaust port.

16. The method according to claim 1, wherein in (a), the precursor gas and the inert gas are supplied from a side of the substrate to the substrate, and in (b), the reaction gas is supplied from a side of the substrate to the substrate.

17. A substrate processing apparatus, comprising:
a process chamber in which a substrate is processed;
a precursor gas supply system configured to supply a precursor gas from a first supplier to the substrate in the process chamber;
a reaction gas supply system configured to supply a reaction gas from a second supplier to the substrate in the process chamber;
a decomposer configured to decompose the precursor gas in the first supplier and in the process chamber; and
a controller configured to control the precursor gas supply system, the reaction gas supply system, and the decomposer so as to perform a process, the process comprising:
forming a film on the substrate by performing a cycle a predetermined number of times, the cycle including non-simultaneously performing:
(a) supplying the precursor gas from the first supplier to the substrate in the process chamber; and
(b) supplying the reaction gas from the second supplier to the substrate in the process chamber,
wherein in (a), an intermediate is generated by decomposing the precursor gas in the first supplier and in the process chamber, the intermediate is supplied to the substrate, and a decomposition amount of the precursor gas in the first supplier is set larger than a decomposition amount of the precursor gas in the process chamber,
wherein in (a), an inert gas is supplied from each of the first supplier, the second supplier, and a third supplier, which are different from one another, to the substrate, and the second supplier and the third supplier are disposed to sandwich the first supplier therebetween, and
wherein in (a), a flow rate of the inert gas supplied from the first supplier is set larger than a flow rate of the precursor gas supplied from the first supplier, and is set larger than a flow rate of each of the inert gases supplied from the second supplier and the third supplier.

18. A non-transitory computer-readable recording medium storing a program that causes, by a computer, a substrate processing apparatus to perform a process, the process comprising:
forming a film on a substrate in a process chamber of the substrate processing apparatus by performing a cycle a predetermined number of times, the cycle including non-simultaneously performing:
(a) supplying a precursor gas from a first supplier to the substrate in the process chamber; and
(b) supplying a reaction gas from a second supplier to the substrate in
the process chamber,
wherein in (a), an intermediate is generated by decomposing the precursor gas in the first supplier and in the process chamber, the intermediate is supplied to the substrate, and a decomposition amount of the precursor gas in the first supplier is set larger than a decomposition amount of the precursor gas in the process chamber,
wherein in (a), an inert gas is supplied from each of the first supplier, the second supplier, and a third supplier, which are different from one another, to the substrate, and the second supplier and the third supplier are disposed to sandwich the first supplier therebetween, and
wherein in (a), a flow rate of the inert gas supplied from the first supplier is set larger than a flow rate of the precursor gas supplied from the first supplier, and is set larger than a flow rate of each of the inert gases supplied from the second supplier and the third supplier.

\* \* \* \* \*